United States Patent
Harker

(10) Patent No.: US 7,189,011 B2
(45) Date of Patent: Mar. 13, 2007

(54) OPTOELECTRONIC ASSEMBLY

(75) Inventor: Andrew Harker, Ipswich (GB)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 199 days.

(21) Appl. No.: 10/646,981

(22) Filed: Aug. 22, 2003

(65) Prior Publication Data

US 2004/0161206 A1    Aug. 19, 2004

(30) Foreign Application Priority Data

Sep. 25, 2002    (EP) .................................. 02256675

(51) Int. Cl.
G02B 6/36    (2006.01)

(52) U.S. Cl. ........................... 385/89; 385/48; 385/49; 385/88

(58) Field of Classification Search ................. 385/88, 385/89, 90, 91
See application file for complete search history.

(56) References Cited

U.S. PATENT DOCUMENTS

| | | | | |
|---|---|---|---|---|
| 5,774,486 | A   | 6/1998  | Jiang et al. ................... | 372/31 |
| 6,536,957 | B1* | 3/2003  | Buchter ........................ | 385/89 |
| 6,647,184 | B2* | 11/2003 | Ukechi et al. ................ | 385/47 |
| 6,760,510 | B2* | 7/2004  | Kimura ........................ | 385/24 |

FOREIGN PATENT DOCUMENTS

| | | |
|---|---|---|
| EP | 0 296 427  | 6/1988 |
| EP | 1 164 367  | 12/2001 |
| JP | 59140651   | 8/1984 |
| JP | 63318789   | 12/1988 |
| JP | 09141476   | 6/1997 |
| JP | 2000266853 | 9/2000 |
| JP | 2001053379 | 2/2001 |
| JP | 2001326419 | 11/2001 |

OTHER PUBLICATIONS

Gnugesser, H., European Search Report Application No. EP 02 25 6675 dated Feb. 24, 2003.

* cited by examiner

Primary Examiner—Jennifer Doan

(57) ABSTRACT

An optoelectronic assembly (300) includes a laser (102) for emitting light along a main optical path. Beam splitters (110, 114) split a proportion of light from the main optical path and the split light is guided by optical light guides (310) to a photodiode array (302). The light guides (310) are mouldable and substantially rigid and can be co fabricated as a single assembly including fiducials to facilitate positioning on a substrate (124) of the assembly (300). By having the array (302) adjacent the periphery of the substrate (124), wirebonds (308) need only be provided directly from the array (302) to a feed-through (130), and electrical tracks on the substrate and ceramic blocks for mounting the photodiodes are eliminated, as is individual placement of the ceramic blocks on the substrate.

17 Claims, 5 Drawing Sheets

OPTOELECTRONIC ASSEMBLY

FIELD OF THE INVENTION

This invention relates to an optoelectronic assembly, particularly, though not exclusively, to an optoelectronic assembly having an optical emitter for emitting light along a main optical path and having at least one optical component in a secondary optical path for measuring characteristics of the light along the main optical path.

BACKGROUND OF THE INVENTION

As is known, in many optical modules in which an optical emitter, such as a laser or an end of an optical fibre from which light is emitted, is in optical communication with another part of an optical communication system along a main optical path, one or more other optical components are arranged to monitor or measure various characteristics of the light in the main optical path. For example, one or more beam splitters are often arranged to direct a small portion of the light from the main optical path to one or more photodiodes to enable the power of the light to be measured. Sometimes the light directed out of the main optical path is passed through one or more other optical components, such as a wavelength dependent filter, to enable the power measured by the photodiodes to be used to determine wavelength as part of a wavelength locker, in which, for instance, the wavelength of a laser is controlled by controlling the temperature of the laser, or for other purposes.

Such optical modules, often, therefore include several photodiodes arranged at different positions in the optoelectronic assembly and electrical signals from the photodiodes are routed through and out of the assembly to a controller which responds to the signals. The photodiodes are usually mounted on ceramic blocks having conductive tracks thereon to which the photodiode is electrically connected using die and wire bonds. The conductive tracks are continuous over at least two sides of the ceramic blocks and further wire bonds are made between the conductive tracks on the ceramic blocks and further conductive tracks provided on a substrate on which the ceramic blocks and the various optical components are mounted. The conductive tracks on the substrate lead to an edge of the substrate from where further wire bonds are provided to a further substrate outside the optical module, which may be hermetically sealed. These further wire bonds between the edges of the two substrates may disadvantageously conduct heat between the two substrates, thereby perturbing the control of the wavelength of the laser, for example.

As is apparent, therefore, such an optical module includes a number of photodiodes on ceramic blocks, which are relatively expensive components, having conductive tracks extending over at least one edge of the block, which is difficult to manufacture, and having a number of wire bonds, which need to be individually made. Furthermore, the photodiodes are distributed over the substrate, thereby requiring individual placement and alignment, and they may operate at different ambient temperatures, thereby ageing at different rates and producing signals which may have different temperature dependencies.

BRIEF SUMMARY OF THE INVENTION

The present invention therefore seeks to provide an optoelectronic assembly, which overcomes, or at least reduces the above-mentioned problems of the prior art.

Accordingly, in a first aspect, the invention provides an optoelectronic assembly comprising an optical emitter for emitting light along a main optical path, at least one mouldable, substantially rigid optical light guide having a first end for receiving a small proportion of the light from the main optical path and a second end, and at least one photodetector located adjacent the second end of the optical waveguide for receiving light there from.

In a preferred embodiment, the optical emitter, the at least one photodetector and the at least one optical light guide are mounted on a substrate and the at least one photodetector is arranged at a periphery of the substrate.

In a further embodiment, the optical emitter is mounted on a substrate and the at least one photodetector is mounted on a second substrate.

Preferably, the optoelectronic assembly includes a plurality of mouldable, substantially rigid optical light guides, and a plurality of photodetectors, the plurality of optical light guides each having a second end located adjacent a respective one of the photodetectors.

The plurality of photodetectors is preferably mounted as an array adjacent the periphery of the substrate or the second substrate.

Preferably, the plurality of optical light guides is manufactured as a single assembly for mounting to the substrate. The or each optical light guide preferably includes at least one structural feature to facilitate interception of the light from the main optical path.

In one embodiment, the optoelectronic assembly further comprises means for splitting a small proportion of light from the main optical path into a secondary light path and wherein the first end of the optical light guide(s) is positioned in the secondary light path.

Preferably, the optical waveguide(s) is made from a stable, low absorption plastics material. The optical waveguide(s) preferably includes one or more fiducials to facilitate alignment of the waveguide to the substrate.

BRIEF DESCRIPTION OF THE DRAWINGS

Two embodiments of the invention will now be more fully described, by way of example, with reference to the drawings, of which.

DETAILED DESCRIPTION OF THE DRAWINGS

Figure 1:
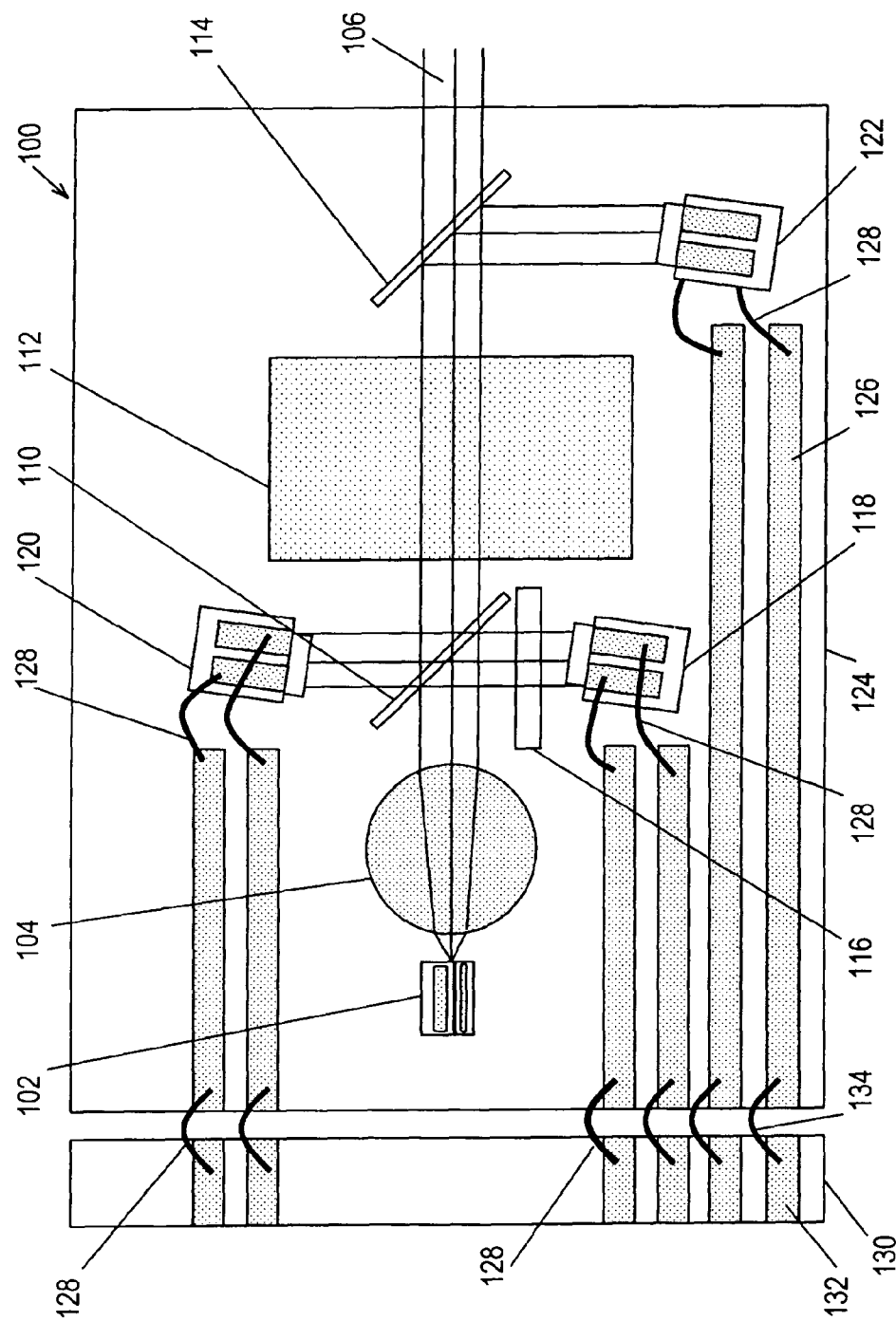
FIG. 1 shows a schematic diagram of a known optoelectronic module.

Thus, FIG. 1 shows schematically a conventional optoelectronic assembly 100 in which light from a laser 102 is collimated by a collimating lens 104 forming a collimated beam 106. The collimated beam 106 may be focused by a focusing lens (not shown) into an optical fibre (not shown). Disposed in the collimating beam 106 are a first beam splitter 110, an optical or optoelectronic component 112, for example a variable optical attenuator or a modulator, and a second beam splitter 114. The first beam splitter 110 is part of a wavelength locker, for example similar to that disclosed in U.S. Pat. No. 6,144,025 (Tei & Makeda), which forms part of a feedback control loop to control the output wavelength of the laser. The wavelength locker also includes a filter 116, a first photodetector 118 and a second photodetector 120. The second beam splitter 114 is part of a power monitor, which also includes a third photodetector 122, for monitoring the power of the light transmitted by the optoelectronic component 112. All the components 102 to 122 are mounted on a substrate 124, which is provided with electrically conducting tracks 126 printed thereon. The photodetectors 118, 120 and 122 are electrically connected to respective tracks 126 using wire bonds 128. The substrate 124 may be mounted in a hermetic package (not shown) provided with a thermally insulated second substrate (feed-through) 130. The feed-through 130 is provided with bond pads 132 to which the tracks 126 are electrically connected by means of further wire bonds 134.

Figure 2:
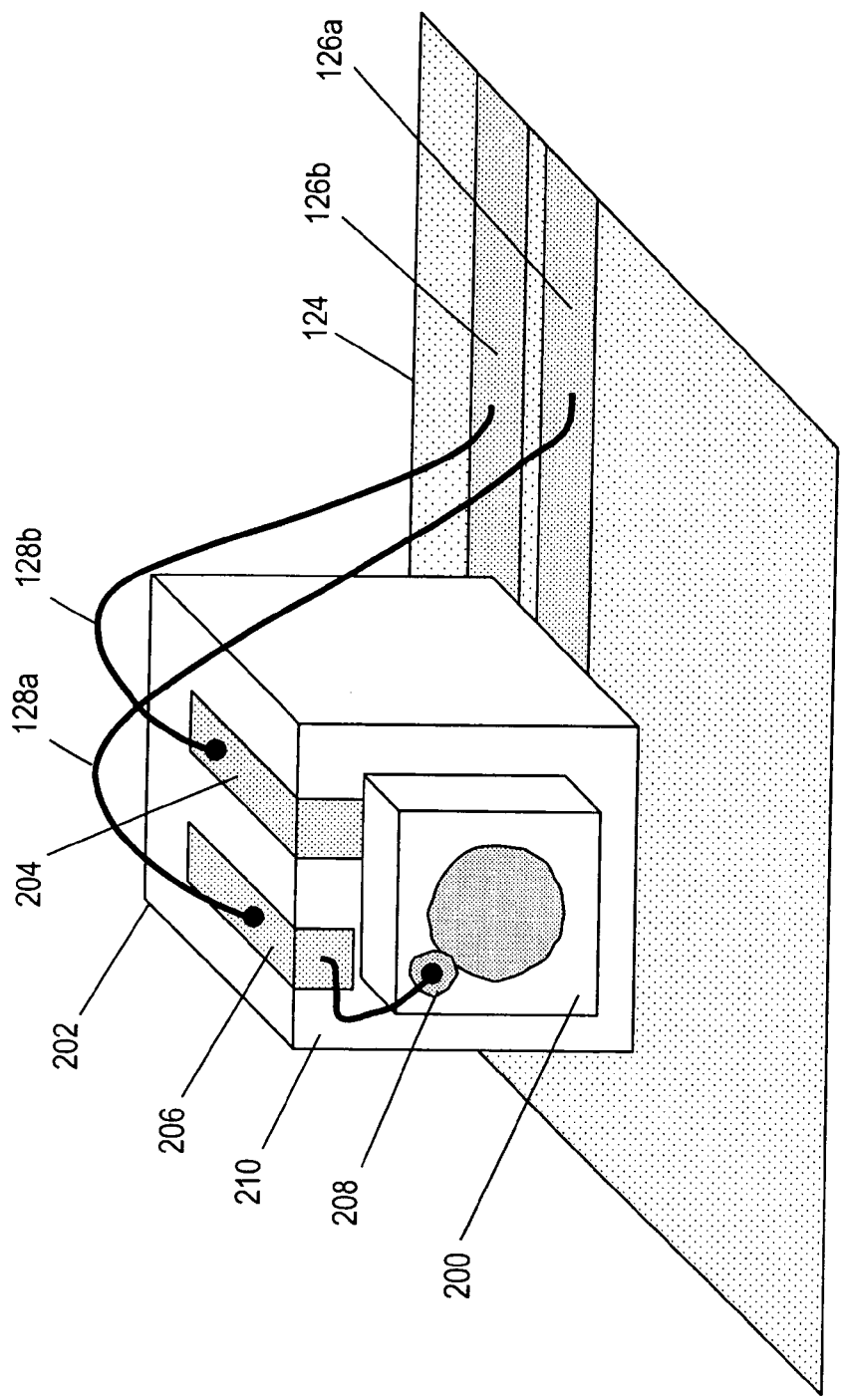
FIG. 2 shows a known photodiode assembly utilised in the module of FIG. 1.

FIG. 2 shows one of the photodetectors 118, 120 and 122 in more detail. A photodiode 200 is mounted on a ceramic block 202, which is provided with a first conductive track 204 and a second conductive track 206, using solder or conductive adhesive such that an electrical connection is made between the rear side of the photodiode 200 and the first conductive track 204. Electrical connection is also made between a bond pad 208 on the front side of the photodiode 200 and the second conductive track 206 by a wire bond 210. The ceramic block 202 is mounted on the substrate 124 using solder or adhesive. Electrical connections are made from the conductive tracks 204, 206 to electrical tracks 126a, 126b on the substrate 124 using wire bonds 128a, 128b.

It will therefore be apparent that the optoelectronic assembly of FIG. 1 requires three ceramic blocks, each having electrical tracks arranged thereon, six electrical tracks on the substrate 124 and 15 wire bonds, as well as individual placement of the ceramic blocks 202 on the substrate 124.

Figure 3:
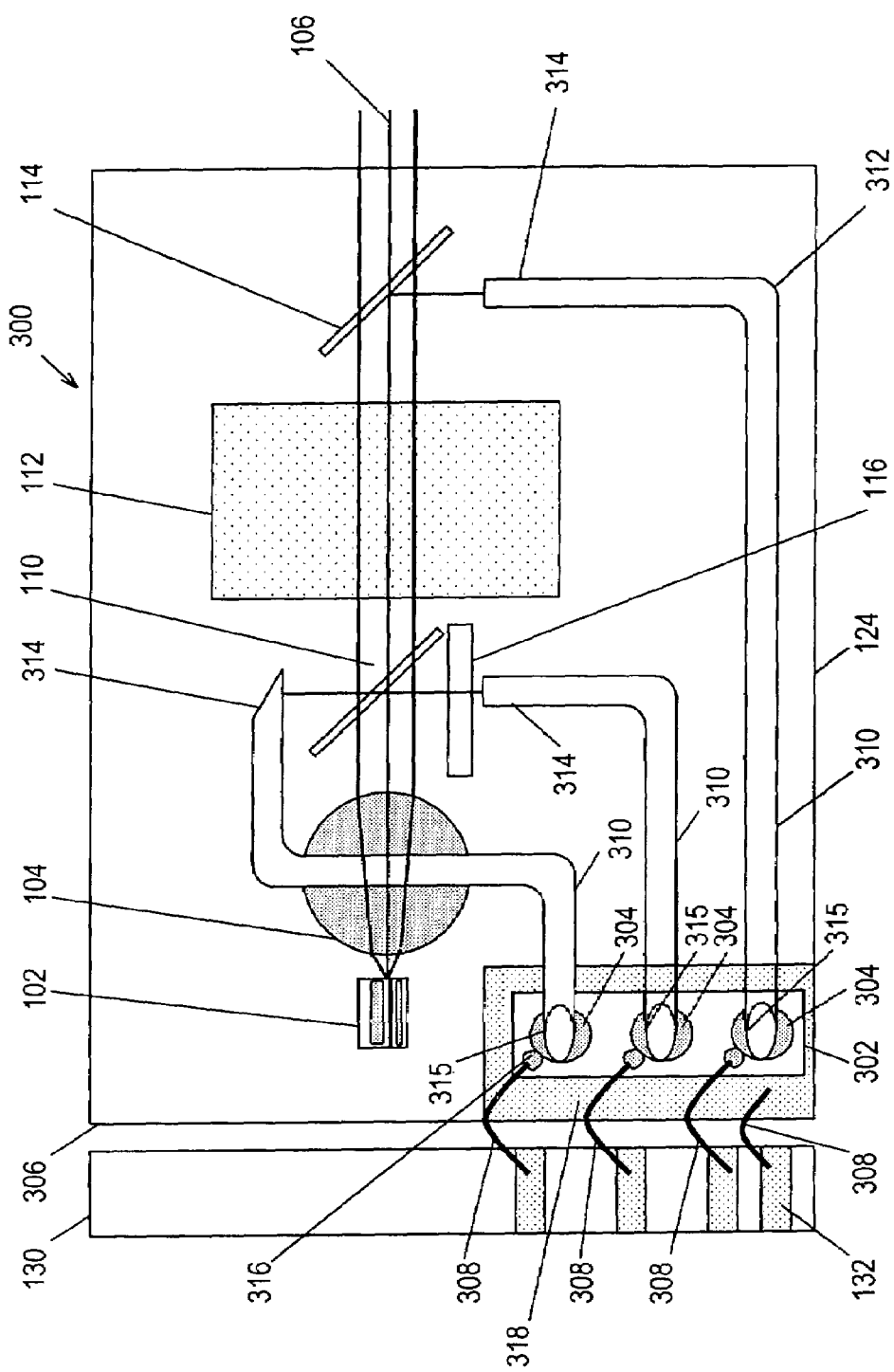
FIG. 3 shows a schematic diagram of an optoelectronic module according to one embodiment of the present invention.
Figure 5:
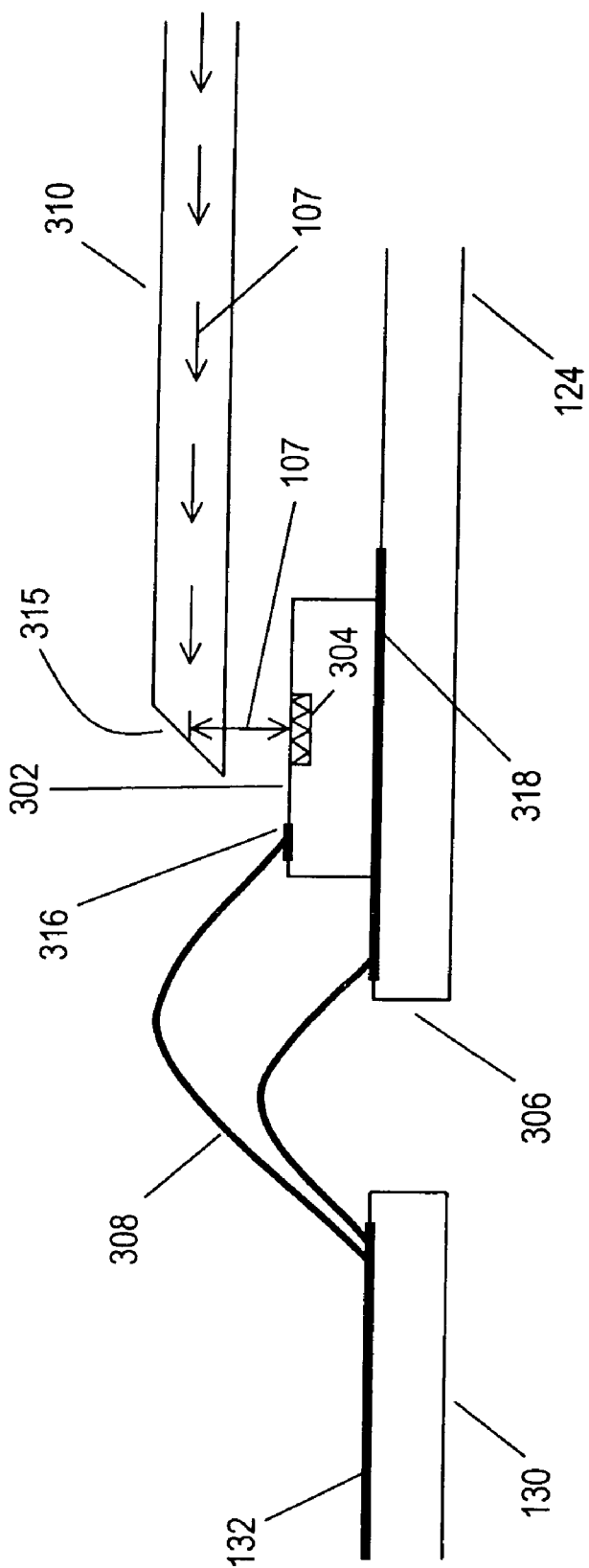
FIG. 5 shows a side elevation of the module shown in FIG. 3.

Accordingly, in a preferred embodiment of the present invention, there is provided an optoelectronic assembly 300, as shown in FIG. 3 and FIG. 5, in which the same elements as described above with reference to FIGS. 1 and 2 have the same reference numerals as in those FIGS. Instead of photodetectors 118, 120 and 122, of FIG. 1, there is provided a photodiode array 302 having, in this embodiment, three photodiodes 304. The array 302 is positioned at periphery of the substrate 124 near an edge 306 thereof adjacent the feed-through 130. The photodiode array 302 is positioned flat on the substrate 124 and is sufficiently close to the feed-through 130 so that wire bonds 308 can be made directly from the bond pads 316 of each of the photodiodes 304, as well as from a common bond pad 318 to which the rear sides of the photodiodes 304 are connected.

Optical light guides 310 are provided to intercept light from the first beam splitter 110, the second beam splitter 114 and the filter 116 and to guide the light 107 to the photodiode array 302. The light guides 310 may have angled facets 314, 315 at their first and second ends respectively, to guide the light into and out of the respective light guide and/or bends 312 to guide the light to their second ends. Preferably, the point of exit of light 107 from the light guides is directly adjacent a respective one of the photodiodes 304.

The light guides 310 may be injection moulded, preferably from a stable, low absorption plastics material for a relatively low cost, thereby allowing the dimensions and the required shape of the optical light guides to be preformed during the moulding process. The light guides 310 can be co fabricated as a single assembly, thus requiring only a single operation to mount them on the substrate 124. If desired, and whether or not the light guides are provided as a single assembly, they can be provided with alignment features, such as projections or fiducials to facilitate location and alignment of the light guides on the substrate 124.

It will therefore be seen that the optoelectronic assembly 300 described with reference to FIG. 3 has only four wire bonds, as compared to fifteen in the optoelectronic assembly of FIG. 1. Furthermore, the substrate 124 only has one bond pad 318 instead of the six tracks 126 of FIG. 1. Also, the three ceramic blocks 202 with "round the corner" metallisation have been eliminated. Since the photodiodes form a single array, all the photodiodes will be at the same location, and will therefore be at the same operating temperature, so that they age at similar rates. Thus, the signals from the photodiodes will not vary differently over temperature or time thereby enabling a controller to respond to the signals correctly.

Figure 4:
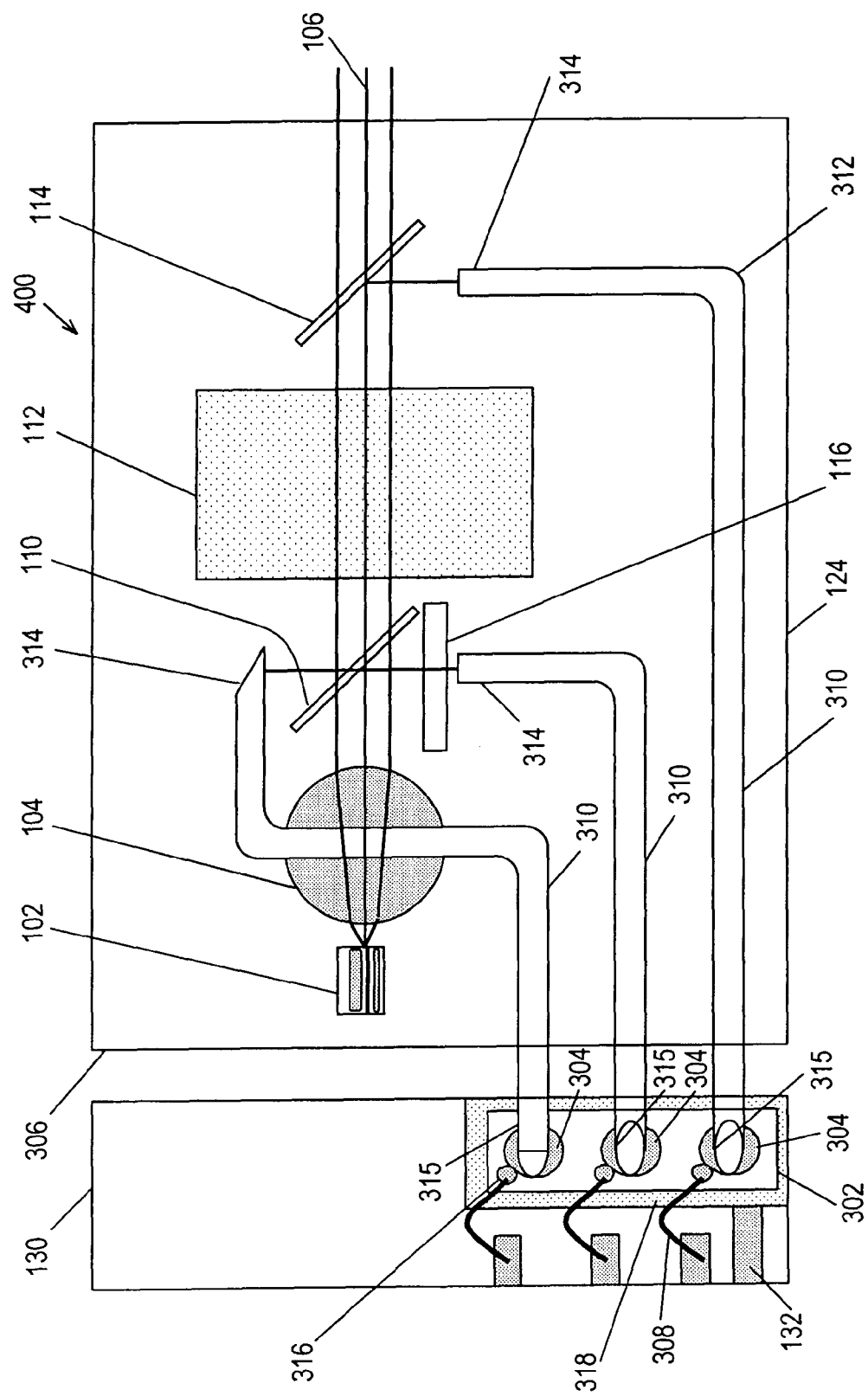
FIG. 4 shows a schematic diagram of an optoelectronic module according to a second embodiment of the present invention.

In a second preferred embodiment of the present invention, there is provided an optoelectronic assembly 400, as shown in FIG. 4, in which the same elements as described above with reference to FIGS. 1, 2 and 3 have the same reference numerals as in those FIGS.

In this second preferred embodiment the photodiode array 302 is mounted on the feed-through second substrate 130, rather than on the substrate 124, thus eliminating the heat conducting wire bonds 308 between the substrate 124 and the feed-through 130. A further wire bond between the common bond pad 318 and its track 132 is also eliminated. Advantageously, the second ends of the light guides 310 are adjacent but not in contact with the photodiode array 302 so that light is coupled between the light guides 310 and the photodiode array 302 but the conduction of heat is minimised.

It will be appreciated that although only two particular embodiments of the invention have been described in detail and that various modifications and improvements can be made by a person skilled in the art without departing from the scope of the present invention.

The invention claimed is:

1. An optoelectronic assembly comprising:
   an optical emitter for emitting light along a main optical path, wherein the optical emitter is mounted on a first substrate;
   a mouldable, substantially rigid optical light guide have a first end for receiving a small proportion of the light from the main optical path and a second end, wherein the optical light guide includes a structural feature to facilitate interception of the light from the main optical path, wherein said structural feature comprises an angled facet; and
   a photodetector located adjacent the second end of the optical light guide for receiving light there from, wherein the photodetector is mounted on a second substrate.

2. An optoelectronic assembly according to claim 1, wherein the optical light guide is mounted on the first substrate.

3. An optoelectronic assembly according to claim 2, wherein the optical light guide includes a fiducial to facilitate alignment of the light guide to the first substrate.

4. An optoelectronic assembly according to claim 1, including a plurality of mouldable, substantially rigid optical guides, and a plurality of photodetectors, wherein the plurality of optical light guides each has a second end located adjacent at a respective one of the photodetectors.

5. An optoelectronic assembly according to claim 4, wherein the plurality of photodetectors is mounted as an array on the second substrate.

6. An optoelectronic assembly according to claim 5, wherein the plurality of optical light guides is manufactured as a single assembly.

7. An optoelectronic assembly according to claim 1, wherein the optical light guide is made from a stable, low absorption plastics material.

8. An optoelectronic assembly comprising:
   an optical emitter for emitting light along a main optical path,
   a mouldable, substantially rigid optical light guide have a first end for receiving a small proportion of the light from the main optical path and a second end, and
   a photodetector located adjacent the second end of the optical light guide for receiving light there from, wherein the optical light guide includes a structural feature to facilitate interception of the light from the main optical path, wherein said structural feature comprises an angled facet.

9. An optoelectronic assembly according to claim 8, wherein the optical emitter, the photodetector and the optical light guide are mounted on a substrate, and the photodetector is arranged at a periphery of the substrate.

10. An optoelectronic assembly according to claim 8, including a plurality of mouldable, substantially rigid optical guides, and a plurality of photodetectors, wherein the plurality of optical light guides each has a second end located adjacent at a respective one of the photodetectors.

11. An optoelectronic assembly according to claim 10, wherein the plurality of photodetectors is mounted as an array adjacent a periphery of the substrate.

12. An optoelectronic assembly according to claim 11, wherein the plurality of optical light guides is manufactured as a single assembly for mounting to the substrate.

13. An optoelectronic assembly according to claim 8, wherein the optical light guide is made from a stable, low absorption plastics material.

14. An optoelectronic assembly according to claim 8, wherein the optical light guide includes a fiducial to facilitate alignment of the light guide to a substrate.

15. An optoelectronic assembly comprising:
   an optical emitter for emitting light along a main optical path, wherein the optical emitter is mounted on a first substrate;
   a mouldable, substantially rigid optical light guide have a first end for receiving a small proportion of the light from the main optical path and a second end, wherein the optical light guide includes a structural feature to facilitate interception of the light from the main optical path; and
   a photodetector located adjacent the second end of the optical light guide for receiving light there from, wherein the photodetector is mounted on a second substrate; and
   a beam splitter for splitting a small proportion of light from the main optical path into a secondary light path, wherein the first end of the optical light guide is positioned in the secondary light path.

16. An optoelectronic assembly comprising:
an optical emitter for emitting light along a main optical path,
a mouldable, substantially rigid optical light guide have a first end for receiving a small proportion of the light from the main optical path and a second end, and
a photodetector located adjacent the second end of the optical light guide for receiving light there from, wherein the optical light guide includes a structural feature to facilitate interception of the light from the main optical path; and
a beam splitter for splitting a small proportion of light from the main optical path into a secondary light path, wherein the first end of the optical light guide is positioned in the secondary light path.

17. An optoelectronic assembly comprising:
an optical emitter for emitting light along a main optical path, wherein the optical emitter is mounted on a first substrate;
a mouldable, substantially rigid optical light guide have a first end for receiving a small proportion of the light from the main optical path and a second end, wherein the optical light guide includes a structural feature to facilitate interception of the light from the main optical path; and
a photodetector located adjacent the second end of the optical light guide for receiving light there from, wherein the photodetector is mounted on a second substrate, wherein said first substrate contains optical feed through of said small proportion of the light without electrical feed through to said photodetector on said second substrate, and wherein said second substrate contains said optical feed through of said optical light guide and an electrical feed through from said photodetector.

\* \* \* \* \*